(12) United States Patent
Narui et al.

(10) Patent No.: US 6,404,790 B1
(45) Date of Patent: Jun. 11, 2002

(54) SEMICONDUCTOR LASER AND MULTI-SEMICONDUCTOR LASER

(75) Inventors: Hironobu Narui, Kanagawa; Takehiro Taniguchi, Tokyo; Noriko Ueno; Nobukata Okano, both of Kanagawa, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/397,073

(22) Filed: Sep. 16, 1999

(30) Foreign Application Priority Data

Sep. 25, 1998 (JP) ............................................. 10-271809

(51) Int. Cl.$^7$ ................................................ H01S 5/00
(52) U.S. Cl. ............................. 372/43; 372/43; 372/66; 372/92; 372/45; 372/46; 372/44
(58) Field of Search .............................. 372/43, 66, 92, 372/46, 45, 44

(56) References Cited

U.S. PATENT DOCUMENTS 5,438,583 A * 8/1995 Narui et al. .................. 372/45
5,541,950 A * 7/1996 Kizaki et al. .................. 372/46

FOREIGN PATENT DOCUMENTS

JP 06-334255 2/1994

* cited by examiner

*Primary Examiner*—Paul Ip
*Assistant Examiner*—Delma R. Flores-Ruiz
(74) *Attorney, Agent, or Firm*—Sonnenschein, Nath & Rosenthal

(57) ABSTRACT

A stripe portion extending in an <011> crystal axis direction of a compound semiconductor substrate (1) in which a {100} crystalline surface is made a major surface is formed between stepped portions (41), a laser resonator is formed in the stripe portion, the width of the stripe portion at one end surface of the laser resonator is made broader in width compared with the central portion and another end surface of the laser resonator. Then, in accordance with the shape of the stripe portion, the stripe shape of an active layer of the laser resonator is made broader in width than the center portion and the other end surface, whereby a semiconductor laser of a narrow field pattern with a low threshold value is obtained.

4 Claims, 11 Drawing Sheets

Wf > Wr
Hf > Hr
Tf < Tr

SEMICONDUCTOR LASER AND MULTI-SEMICONDUCTOR LASER

BACKGROUND OF THE INVENTION

1. Field of the Invention

The present invention relates to a semiconductor laser and a multi-semiconductor laser which have a narrow far field pattern (hereafter, referred to as a FFP) by a low threshold value electric current.

2. Description of the Related Art

As a low threshold electric current semiconductor laser, there is a SDH (Separated Double Heterostructure) laser. The SDH laser is, as a schematic cross-sectional diagram thereof is shown in FIG. 1, such that a first conductivity-type, that is, a GaAs substrate 1 whose one major surface of a p-type is made a (100) crystalline surface is prepared and on the one major surface by the (100) surface is formed a straight stripe-shaped ridge 2 extending in a [110] axis direction and on the major surface of the substrate 1 having the ridge 2 are epitaxially grown, by turns, a buffer layer 3 consisting of a p-type GaAs of the first conductivity-type, a first cladding layer 4 consisting of a p-type AlGaAs, an active layer 5 by, for example, a multi-quantum well structure, a second cladding layer 6, 8 consisting of an n-type AlGaAs of a second conductivity-type, an AlGaAs electric current layer 7 of a pnp structure in which, for example, a p layer, an n layer and a p layer are superimposed by turns and a capping layer 9 consisting of an n type GaAs of the second conductivity-type, by an MOCVD (Metal Organic Chemical Vapor Deposition) method.

In the above-mentioned MOCVD of respective semiconductor layers, methyl system organic metals are used as raw materials. In the case, there occurs a non-growth surface of {111} B surfaces on the ridge 2 and on the {111} B surfaces occurs a fault between a semiconductor layers which have grown on grooves on both side of the ridge 2 and the B surface and a cross-sectional triangle shaped semiconductor portion 10 sandwiched between inclined surfaces by the {111} B surfaces is formed on the ridge 2.

A semiconductor laser by the SDH structure is capable of forming a narrow width active layer 5 in a cross-sectionally triangle shaped semiconductor portion 10 on the ridge 2, and also, since the AlGaAs electric current blocking layer 7 of the pnp structure can be formed on the both side thereof, it is possible to effectively supply an electric current into the active layer 5 of the semiconductor portion 10 to thereby carry out laser oscillation.

Further, in the arrangement, since the electric current blocking layer 7 has the same band gap as that of the cladding layer, a light which has generated in the active layer 5 of the semiconductor portion 10 is trapped in a lateral direction (a width direction of the stripe), thereby making it possible to carry out reduction of a threshold electric current $1_{th}$.

By the way, as in the SDH type laser, a semiconductor laser, which has the straight stripe active layer, and in which the width of the active layer is particularly narrow and lowering of the low threshold value is realized has a large FFP pattern and a tendency of a spreading angle of the laser beam becoming large.

Then, in the semiconductor laser with the laser beam having the large spreading angle, a lens with a large numerical aperture NA becomes necessary, and when a lens with a small numerical aperture is used, efficiency in the use of light is lowered.

On the other hand, a semiconductor laser for reducing the FFP pattern is proposed in a Japanese laid-open patent publication No. 6-334255. The semiconductor laser i s, as its schematic cross-sectional diagram is shown in FIG. 2, such that in the above-mentioned SDH type laser structure of FIG. 1, a width in the vicinity of an end surface in a longitudinal direction of the resonator of the stripe-shaped ridge 2 is made wide, and in response to this, a width at an end portion of the active layer 5 of the cross-sectionally triangle shaped semiconductor portion 10 is made wider than that in the central portion, thereby making small the FFP pattern of a laser light generate d from the end portion. Meanwhile, in FIG. 2, an overlapping explanation will be omitted by attaching the same referential numerals to the portions corresponding to those in FIG. 1.

However, since the threshold value electric current of a semiconductor laser depends on the width of an active layer forming a resonator, in a case where the width in the vicinity of the end surface of the resonator is, as mentioned above, made wider, a value of an electric current value for oscillation at the active layer in the vicinity of the end surface becomes larger than the central portion, and as a result, the threshold value for oscillation electric current becomes higher compared with an SDH type the laser which has a uniformly narrow stripe width.

Particularly, in a case where a multi-semiconductor laser in which a plurality of laser elements are arranged and integrated on a same substrate is arranged, when the threshold electric current becomes higher in the laser element, heat generation becomes large, and due to a heat influence on the neighboring semiconductor laser elements, that is, mutual heat interference, there occurs a change in a laser oscillating characteristic in each element, a reduction in reliability as well as a life cycle, thereby exerting an influence on the characteristic of the multi-semiconductor laser.

Then, in the multi-semiconductor laser, it is desirable that the threshold electric current becomes as smaller as possible in each semiconductor laser element.

Also, as a light source of, for example, a laser light printer and the like, there is a case in which there is a demand that a droop characteristic be limited to within several percent. In this case, there is used such a technique in which a reflection factor Rf at a front end surface forming a front light emitting end which emits an inherent laser light is made higher than a reflection factor Rr at a rear end surface on an opposite side therefrom, that is, Rf>Rr is satisfied.

Then, when the reflection factor Rr at the rear end surface is made small and further, the width of the resonator at the rear end surface is made wider, the emitting light quantity from the rear side becomes large and further, its emitting angle becomes small.

By the way, in generally driving the semiconductor laser, for example, its power control is such that the intensity of the rear emitting light from the rear of the semiconductor laser proportionate to the front emitting light is detected by a photo-detector element, generally, a photo-diode and the detected output is used as a power control signal by monitoring the power of the front emitting light.

But, when the amount of the rear emitting light is large and the emitting angle is small, as mentioned above, there entails an efficient incidence of a strong laser light into the photo-diode, and absorption of the light becomes saturated, thereby incurring a problem that correct monitoring of light output can not be carried out.

SUMMARY OF THE INVENTION

An object of the present invention is to make the FFP pattern small and further, to implement a reduction of the threshold value of electric current. Further, by implementing a reduction in light density of the rear side emitting laser light, the saturation in the detection of the rear side emitting laser light for monitoring the output by, for example, the semiconductor laser is to be avoided.

According to an aspect of the present invention, there is provided a semiconductor laser in which a stripe portion extending in an <011> crystal axis direction of a compound semiconductor substrate wherein a {100} crystal surface is made a major surface is formed between stepped portions and in the stripe portion is arranged a laser resonator and the width of the stripe portion is made wider on one end surface side compared with those in the central portion as well as on the other end surface side. Then, in accordance with the shape of the stripe portion, the stripe shape of an active layer of a laser resonator is made wider compared with those in the central portion and at the other end surface.

Also, according to another aspect of the present invention there is provided a multi-semiconductor laser which is arranged such that a plurality of semiconductor laser elements by the above-mentioned arrangement of the semiconductor laser according to the present invention are disposed on a common compound semiconductor substrate.

In the semiconductor laser according to the present invention, since the width is made wider only at the one end surface of the resonator, the FFP pattern is scaled down with respect to the front emitting laser light is concerned, and with respect to the other end surface, as a required narrow width arrangement, an increase in a threshold value electric current is alleviated and also, with respect to the rear emitting laser light, since the resonator is not arranged thereby, the emitting angle of the rear emitting laser light is made large to thereby avoid saturation in detecting a monitoring laser light.

Then, in a multi-semiconductor laser, by alleviating an increase in the threshold value electric current, mutual heat interferences among the laser elements is to be avoided.

DESCRIPTION OF THE PREFERRED EMBODIMENTS

One example of a semiconductor laser according to the present invention will be explained with reference to the schematic perspective view in FIG. 1, but it goes without saying that the present invention is not limited to the example.

Figure 3:
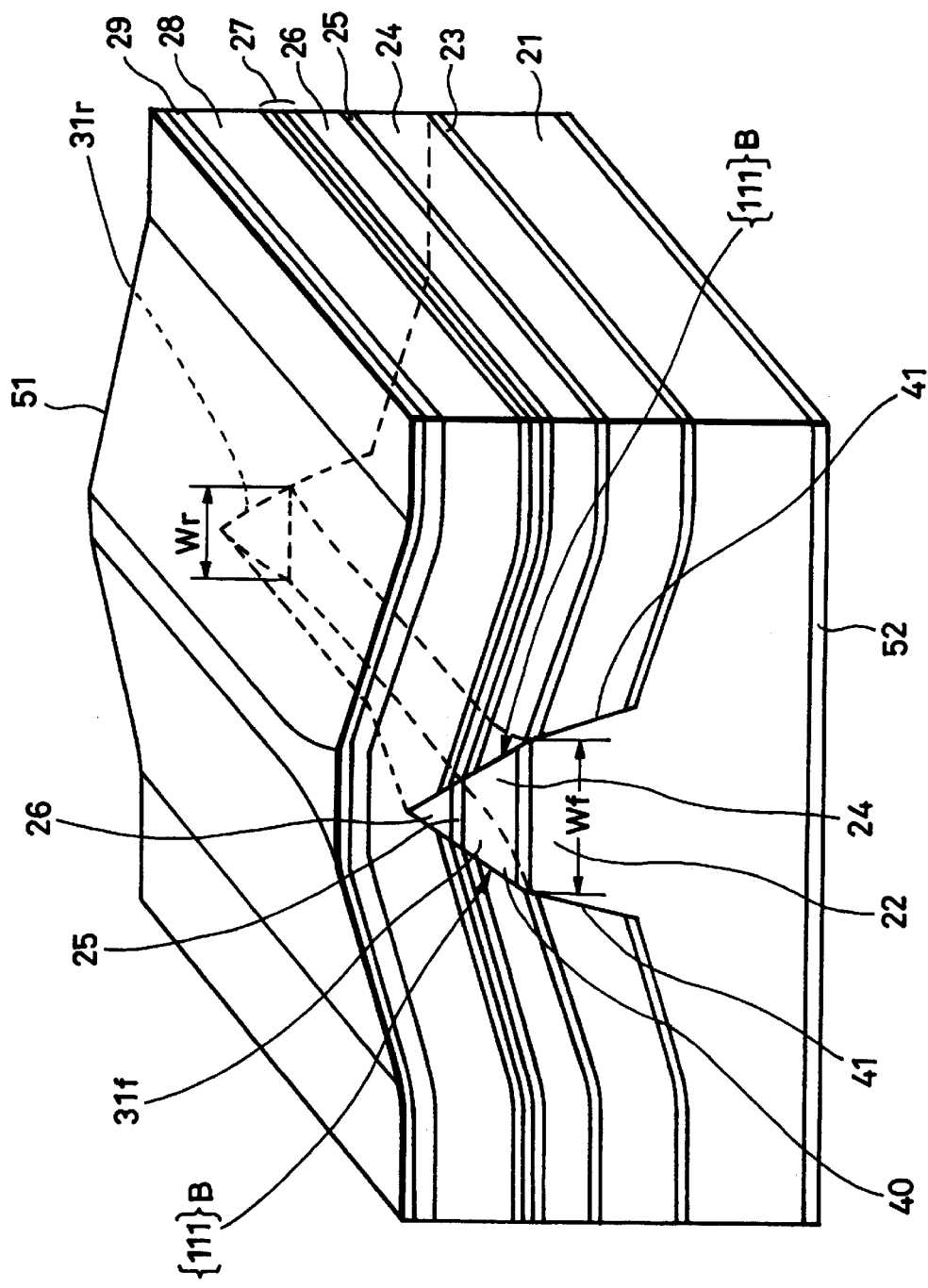
FIG. 3 is a perspective view of one example of the semiconductor lasers according to the present invention.

As shown in FIG. 3, in the example, a compound semiconductor substrate 21 consisting of a first conductivity-type, for example, p-type GaAs is prepared and on one major surface thereof consisting of a {100} crystalline surface, for example, (100) crystalline surface, a ridge 22 is formed sandwiched between a pair of stripe shaped parallel stepped portions 41 which extend in an <011> crystal axis direction, that is, [011] crystal axis direction.

The formation of the stepped portion 41, that is, ridge portion 22 is done so by a photo-lithography, for example, whet etching.

Then, on the whole surface of the substrate 21 where the ridge 22 is formed are successively formed by way of epitaxially growth a buffer layer 23 of a first conductivity-type, by, for example, a p-type GaAs, a first cladding layer 24 of the first conductivity-type consisting of, for example, a p-type AlGaAs, an active layer 25 of a multi-quantum well structure, a low layer second cladding layer 26 of the second conductivity-type consisting of, for example, n-type AlGaAs, an electric current blocking layer 27 of a pnp arrangement, an upper layer cladding layer 28 of a second conductivity-type consisting of, for example, n-type AlGaAs and a capping layer 29 of the second conductivity-type consisting of, for example, n-type GaAs.

These epitaxially growths are formed by an MOCVD using methyl system materials such as, for example, TMGa (tri-methyl-gallium), TMA (tri-methyl-aluminum) and $AsH_3$ (arsine). In this case, once the {111} B crystalline surface is generated on both side edge of the ridge 22 which extends in the [011] crystal direction, since it becomes difficult for the epitaxial growth to occur on the {111} B crystalline surface, on the ridge 2 a cross-sectionally triangle shaped semiconductor portion 40 sandwiched between the {111} B crystalline surfaces is formed separated from the respective semiconductor layers which have grown from the bottom of groove portions on the both sides of the ridge 22.

In this case, in the cross-sectionally triangle shaped semiconductor portion 40, the height and width of the ridge 22 and the thicknesses of respective layers are set so that the buffer layer 23, the first cladding layer 24, the active layer 25 and the low layer second cladding layer 26 are grown, the end surface of the electric current blocking layer 27 of the pnp arrangement, which is grown on the bottom portion of the above-mentioned groove portion on the both sides of the ridge 22, abuts the both side edges of the active layer 25 and further, covering the semiconductor portion 40, the upper layer second cladding layer 28 and the capping layer 29 are grown.

Then, respectively on the capping layer 29 and on the rear surface of substrate 21, a first electrode 51 of a laminated structure with, for example, AuGeNi and Au and a second electrode 52 of a laminated structure with AuZn and Au are respectively ohmic-deposited.

Figure 1:
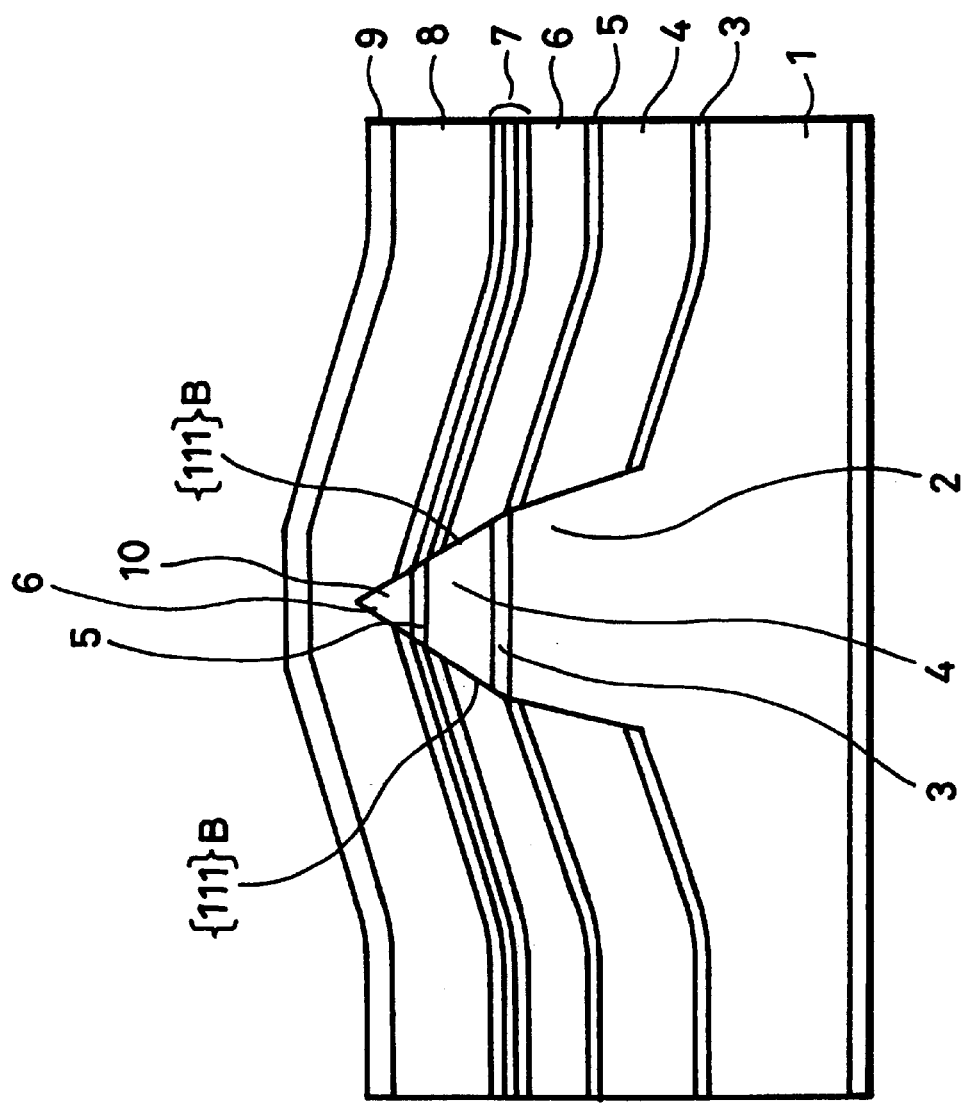
FIG. 1 is a cross-sectional view of a conventional semiconductor laser.
Figure 2:
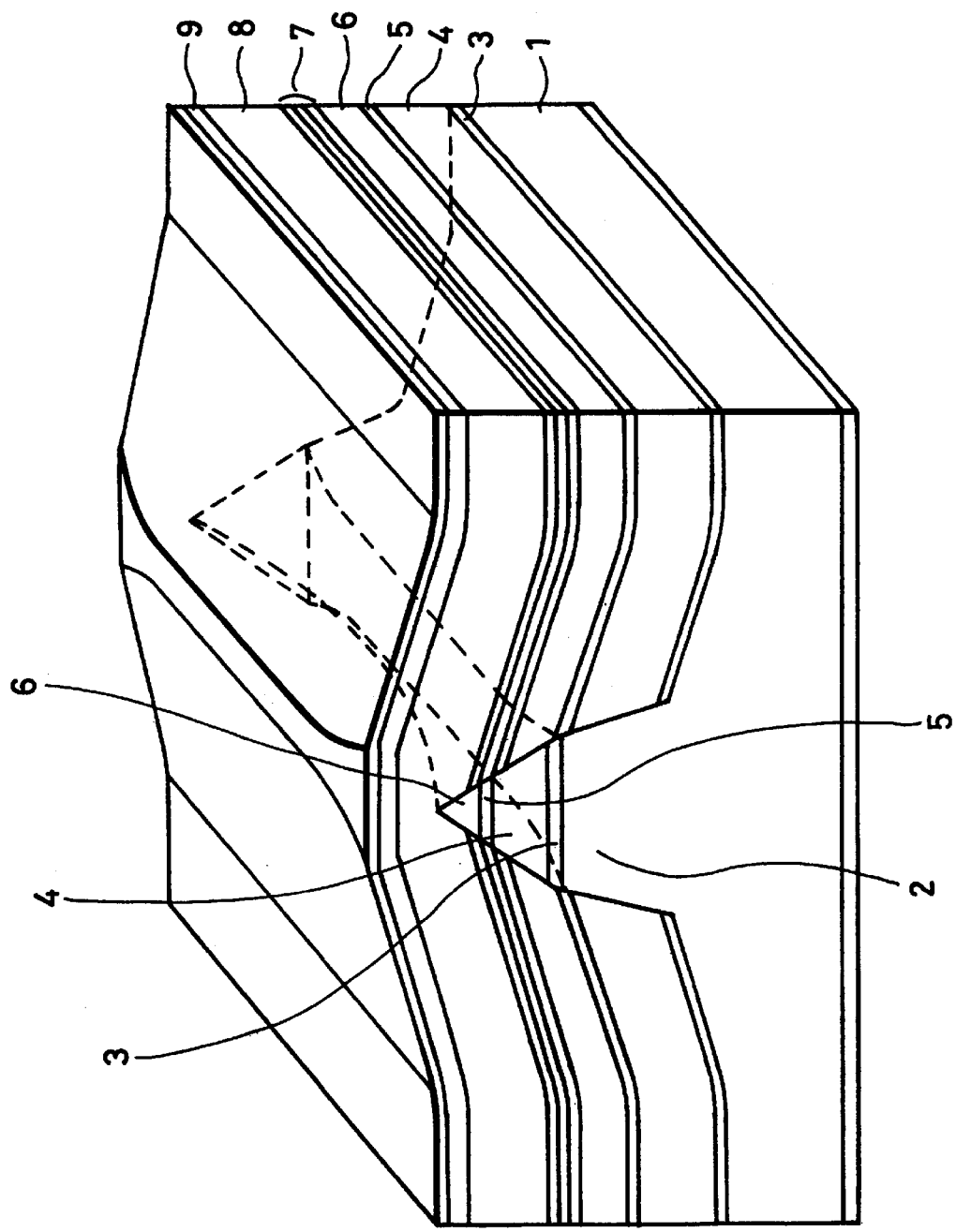
FIG. 2 is a perspective view of the conventional semiconductor laser.

According to the arrangement, as are explained in FIG. 1 and FIG. 2, since the electric current blocking layer 27 is disposed on the both sides of the semiconductor portion 40, an electric current can limitedly be injected into the active layer 25 in the semiconductor portion 40 and oscillation of a laser is carried out in the semiconductor portion 40. In this case, on both end surfaces of the resonator, that is, a front end surface 31f having a front light emitting end surface and a rear end surface 31r arranging a rear light emitting end surface are formed optical reflecting surfaces with reflection factors respectively being Rf and Rr, for example, dielectric films. Then, in this case, when the droop characteristic is taken into consideration, Rf is made larger than Rr.

Figure 4:
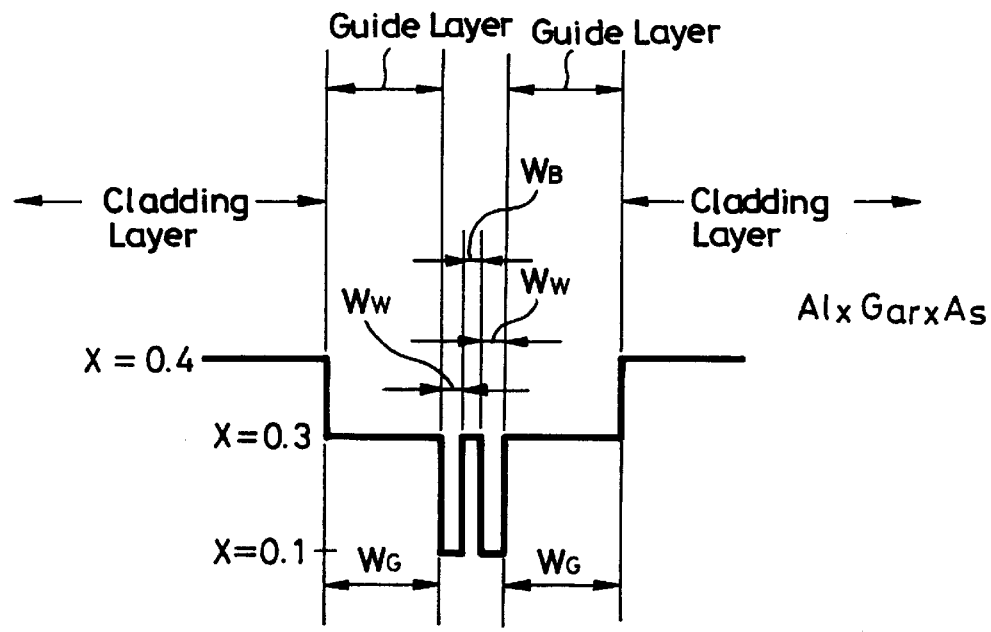
FIG. 4 is an energy model diagram of an edge portion on a conductive band side of an active layer of one example of the semiconductor lager according to the present invention.

In the above-mentioned arrangement, the active layer 25 is made, for example, a multi-quantum well structure. The active layer 2, for example, as a model on a conduction band side of its energy band gap is shown in FIG. 4, in a case of, for example, $Al_xGa_{1-x}As$ (x is an atomic ratio), can be made a structure in which a well layer with x being, for example, 0.1 and a thickness (width) $W_W$ being, for example, 80 Å and a barrier layer with x being, for example, 0.1 and a thickness (width) $W_B$ being, for example, 50 Å are laminated between the cladding layers 24 and 26 with x being 0.4 through, for example, a guide layer (no t shown in FIG. 1) with x being 0.3 and a thickness (width) $W_G$ being, for example, 500 Å.

Figures 5A, 5B, 5C:
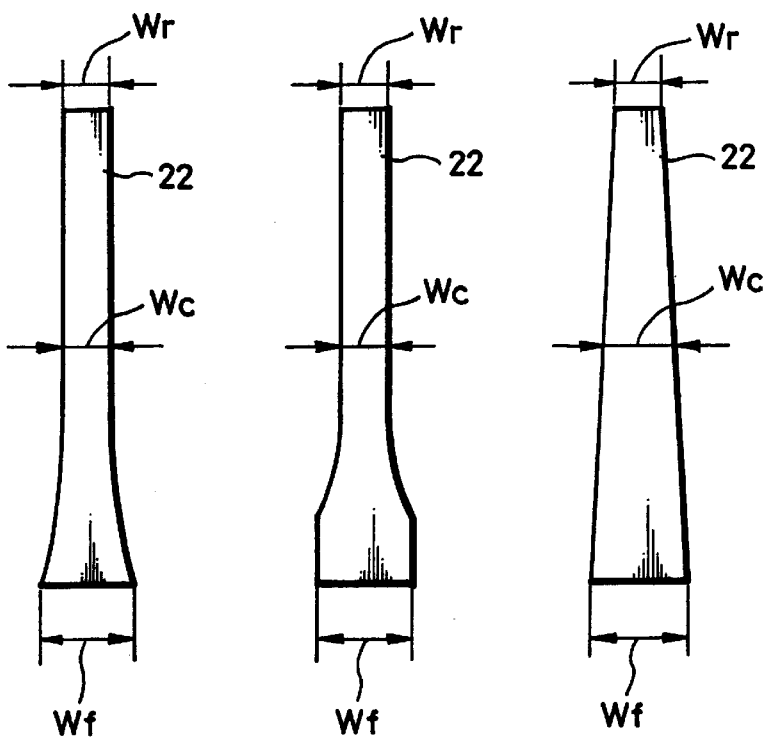
FIGS. 5A to 5C are plan pattern diagrams each showing an example of a ridge of the semiconductor laser according to the present invention.

Then, in the arrangement of the semiconductor laser according to the present invention, a plane pattern of the above-mentioned ridge 22 is, as is shown in FIGS. 5A, 5B and 5C, a width Wf on the front end surface side is selected to be larger than a width Wc at the central portion and a width Wr on the rear end surface side.

In this case, the ridge 22 can be made various kinds of shapes such as, as shown in FIG. 5A, a curved shape which locally becomes gradually wider toward the front side as well as a shape which can be formed, as shown in FIG. 5B, in a step-wise fashion and a shape which becomes wider in a taper state from a rear side to a front side, as shown in FIG. 5C.

Figure 6A:
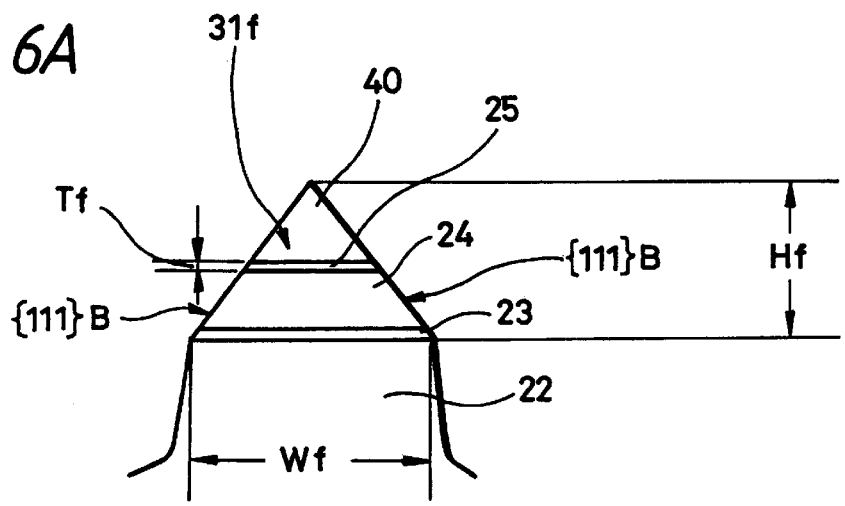
FIGS. 6A and 6B are respectively a front view and a rear view on a front end surface side and a rear end surface side of the semiconductor laser according to the present invention.
Figure 6B:
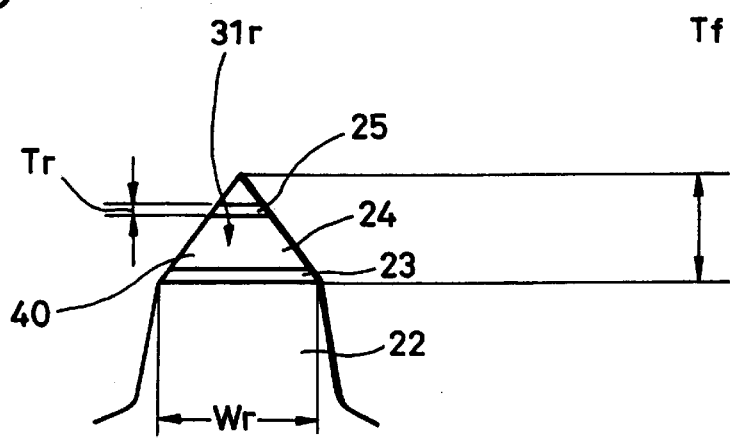

FIGS. 6A and 6B show respectively a front view of the ridge 22 of the above-mentioned arrangement and the semiconductor portion 40 thereupon from a front end surface 31f side and a rear view from a rear end surface 31r side. That is, as mentioned above, since the width Wf on the front end surface side and the width Wr on the rear end surface side are made Wf>Wr, a height Hf on the front end surface side of the semiconductor portion 40 formed sandwiched between the {111} B surfaces is larger than a height Hr on the rear end surface side and that is, Hf>Hr is satisfied.

However, the thickness of the active layer 25 in the semiconductor portion 40 is, when a thickness on the front end surface side is set at Tf and a thickness on the rear end surface side is set at Tr, it becomes that Tf is smaller than Tr. This is because diffusion from a lateral direction (width direction) due to the migration of the MOCVD becomes larger as the width becomes smaller.

FIGS. 6A and 6B show a comparison between the front end surface side and the rear end surface side, and in the present invention, since the width Wf on the front end surface side is made larger than the width Wr on the rear end surface side and the width Wc in the central portion, that is, Wf>Wr, Wc, when the height of the semiconductor portion at the central portion is made Hc and the thickness of the active layer 25 is made Tc, it becomes that Hf>Hr, Hf>Hc and Tf<Tr, Tf<Tc.

Figure 7:
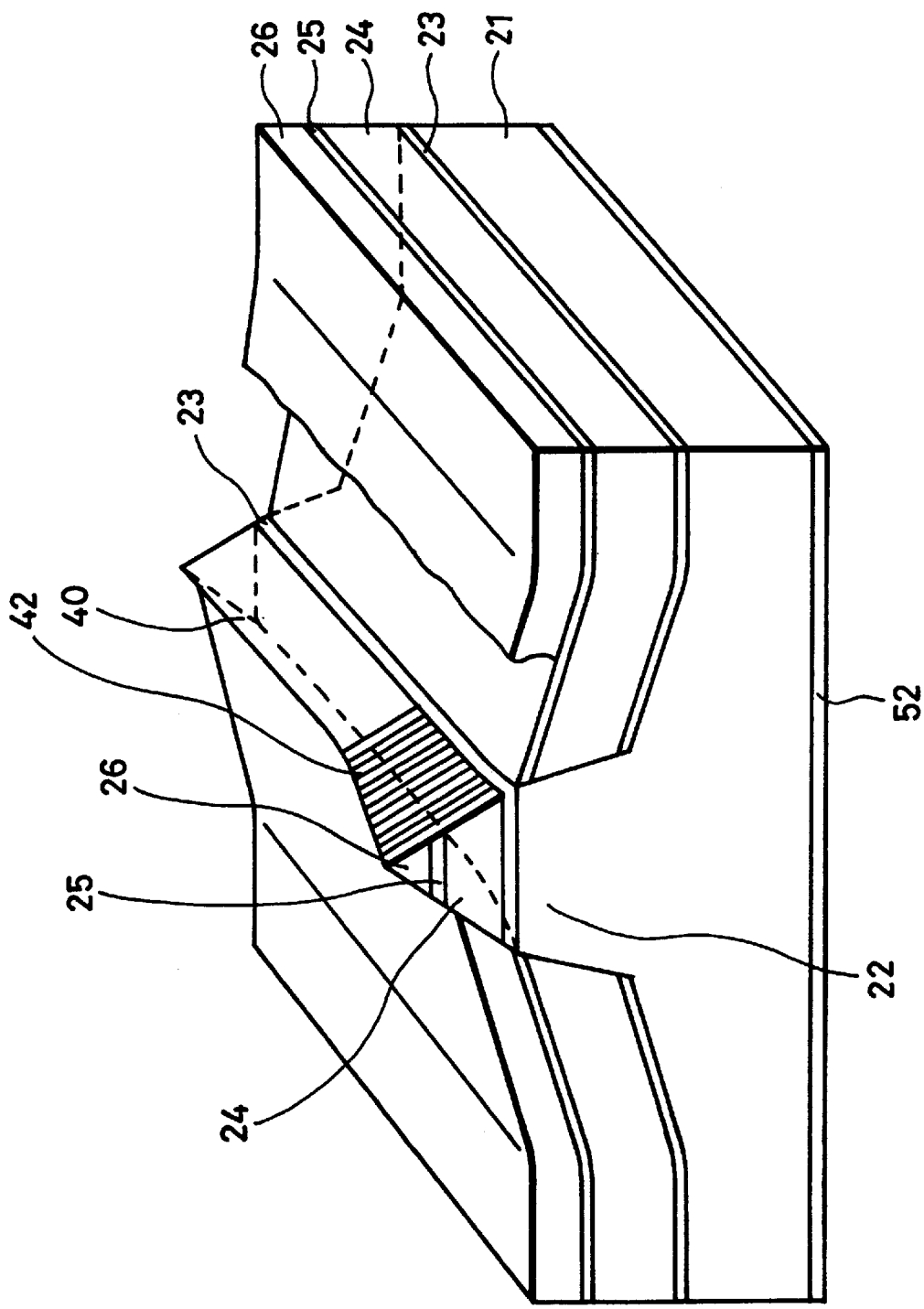
FIG. 7 is a perspective view of an essential portion of one example of the semiconductor laser according to the present invention.

As mentioned above, in the arrangement of the present invention, since the width Wf on the front end surface side is made larger than those at the other portions, as explained in FIGS. 5A to 5C, at the side edges of the ridge 22 exist a curved portion or a taper portion, and since the portion is inclined toward the [011] axis direction, a single {111} B surface does not occur on the inclined side surface in the portion of the cross-sectionally triangle shaped semiconductor portion 40, and as a perspective diagram of the state in which the buffer layer 23 to the lower layer second cladding layer 26 are epitaxially grown is shown in FIG. 7, a congregating inclined {111} B surface 42, where the {111} B intermittently occur, is formed.

In the above arrangement, when the length of the ridge 22 is set to 300 μm, the width Wf on the front end surface is set to 6 μm, the width in the Central portion and the width on the rear light emitting end surface side are set to Wc=Wr=4 μm, the width of the active layer 25 becomes 3 μm on the front end surface side and 1 μm on the rear light emitting end surface side. Then, at that time the thickness of the active layer 25 on the front end surface side became ⅓ of those at the central portion and on the rear light emitting end surface side.

As for an FFP of an emitting laser light from the front end surface, a spreading angle $\theta_H$ in a horizontal direction along the major surface of the substrate 21 was about 15° and a spreading angle $\theta_V$ in a direction perpendicular to this became about 30°. This is substantially equivalent to an FFP of a laser light of an SDH type semiconductor laser in which broad width portions are formed at the both ends of the resonator. By the way, with the FFP of the SDH type semiconductor laser in which the active layer is made 1 μm in a uniform width ranging across the whole area, it became that $\theta_H$=30° and $\theta_V$=40°.

Then, as to a threshold value electric current electric current $1_{th}$, according to the arrangement of the present invent ion, it was possible to make $1_{th}$=5 mA. Compared with this, in the SDH type semiconductor laser in which the broad width portions are formed at the both ends of the resonator, the FFA became $1_{th}$=7 mA.

Also, according to the semiconductor laser of the present invention, since the thickness of the active layer 25 is arranged thin on the front end surface side, when the active layer 25 is a single or multi-quantum well structure, a quantum level is raised by the thickness becoming thinner and as a result, a light which is generated at the center and the rear becomes transparent in a front area, and since absorption of the light is reduced in the portion, generation of heat is effectively avoided, thereby arranging a so-called well structure to thereby implement a high output.

Also, in the arrangement of the semiconductor laser, even in a case where the reflection factor at the rear end surface is made lower than that at the front end surface to implement an improvement in the droop characteristic, since the FFP is made large by avoiding making large the width of the active layer, that is, the width at the end surface of the resonator on the rear end surface side, that is, by an emission angle of a rear laser light being made large, at a time when the rear laser light is received by a light detecting element such as a monitoring photo-diode and the like, even though the light detecting element is disposed in the vicinity, a light density received by the element can be reduced, thereby making it possible to surely carry out power detection of the laser light without saturating the light detection.

Meanwhile, the semiconductor laser according to the present invention shown in FIG. 3 can, needless to say, be simultaneously manufactured in plurality of pieces by way of mass production from the common semiconductor substrate 21. That is, in this case, on the substrate 21, a plurality of the ridges 22 are parallelly disposed in plural numbers of pieces, and on the substrate 21 where the plurality of the ridges 22 are formed, the above-mentioned semiconductor layers 23~29 are simultaneously formed over the whole surface thereof and the cross-sectionally triangle shaped semiconductor portions 40 is formed on each of the ridges 22 and further, the first and second electrodes 51 and 52 are deposition-formed. Thereafter, the substrate is cut off at every ridge 22 to produce a stick and each stick body is cut to a required length of the resonator, thereby making it possible to simultaneously obtain the plurality of the semiconductor lasers.

Figure 9:
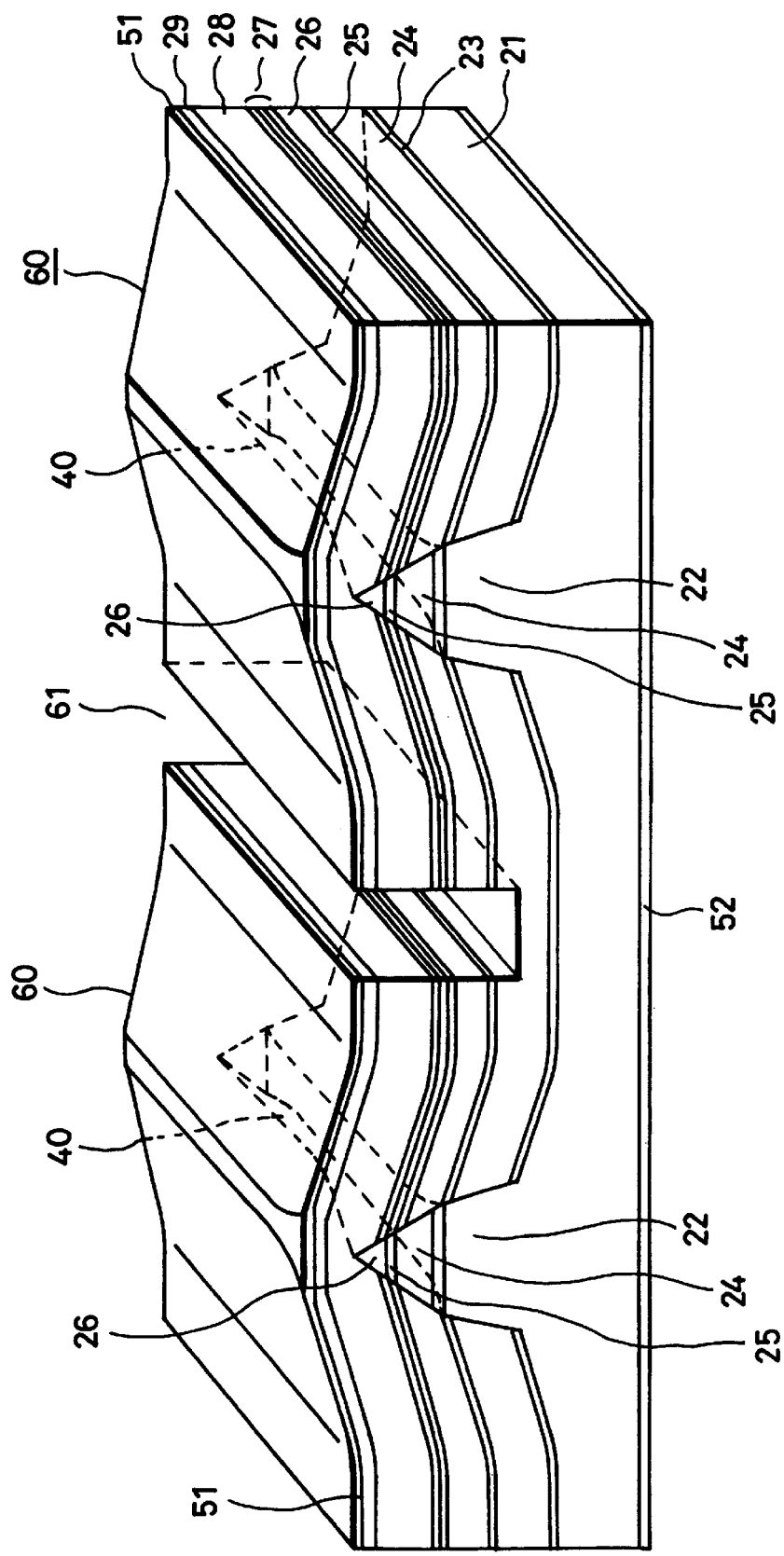
FIG. 9 is a perspective view of one example of a multi-semiconductor laser according to the present invention.

Also, a multi-semiconductor laser according to the present invention is formed by disposing, for example, the semiconductor laser shown in FIG. 3 on a common substrate as a semiconductor laser element. FIG. 9 shows a perspective diagram of one example of a multi-semiconductor laser having two pieces of semiconductor laser elements 60. In the example, 2 pieces of the ridges 22 are formed on the common substrate 21, and ranging over the whole surface of the ridges 22, for example, the buffer layer 23, the first cladding layer 24 and further, the active layer 25 of, for example, the multi-quantum well structure described in, for example, FIG. 4 the lower layer cladding layer 26, the electric current blocking layer 27 of the pnp structure, the upper layer second cladding layer 28 and the capping layer 29, are epitaxially grown by the same method explained in FIG. 3 and, the cross-sectionally triangle shaped portion 40 in which the active layer 25 is sandwiched between the first cladding layer 24 and the second cladding layer 26 up and down is formed on each ridge 22 separated from the respective layers on both sides thereof.

Then, on the capping layer 29 and on the reverse surface of the substrate 21, for example, the above-mentioned same first and second electrodes 51 and 52 are respectively formed by way of ohmic-deposition.

Thereafter, between the two pieces of the ridges 22, along the extended direction of these ridges 22, a separating groove 61 is formed by the depth ranging from the first electrode 51 to the first cladding layer 24, thereby separating the semiconductor laser elements 60 formed on the respective ridges 22.

In this manner, an integrated multi-semiconductor laser according to the present invention is arranged which has, on the common substrate 21, two pieces of the semiconductor laser elements 60 each having the resonator with respect to each ridge 22.

Meanwhile, in the example of FIG. 9, the multi-semiconductor laser having 2 pieces of the semiconductor laser elements 60 is shown, but it is possible to arrange a multi-semiconductor laser in which an arbitrary number of the laser elements 60 exceeding 2 pieces are disposed.

Also, with the multi-semiconductor laser, it is of course possible to simultaneously manufacture a plurality of the multi-semiconductor lasers.

Then, with the multi-semiconductor laser according to the present invention, the FFP with respect to the front laser light can, as mentioned above, be made smaller by making the width of the resonator of its semiconductor laser element wide on the front end surface side, but, since the broad structure on the rear end surface side is avoided, it is possible to implement the reduction of the threshold value electric current $I_{th}$ in each semiconductor laser element 60. Therefore, the mutual heat interference between the closely approaching semiconductor laser elements can be avoided, thereby making it possible to improve the fluctuation of its characteristic, its reliability and its life span.

Then, in this case, too, even in a case where the reflection factor at the rear end surface is made lower than that at the front end surface so as to improve the droop characteristic, since the FFP is made large by avoiding making large the width of the active layer, that is, the width the resonator on the rear end surface side, that is, by an emission angle of the rear laser light being made large, at a time when the rear laser light is received by a light detecting element such as a monitoring photodiode and the like, even though the light detecting element is disposed in the vicinity, a light density received by the element can be reduced thereby making it possible to surely carry out power detection of the laser light without saturating the light detection.

Figure 10:
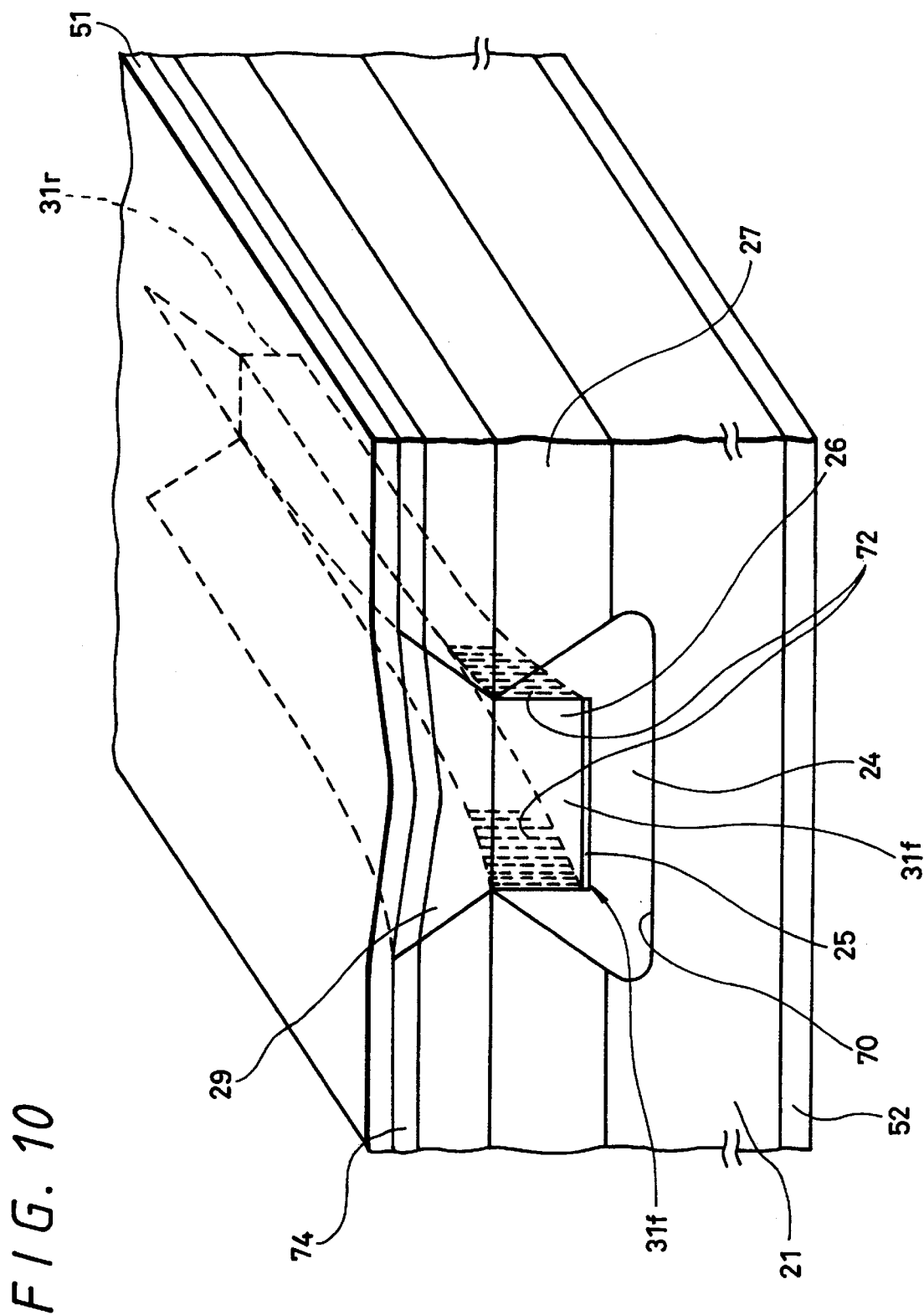
FIG. 10 is a perspective view of another one example of the semiconductor laser according to the present invention.
Figure 11:
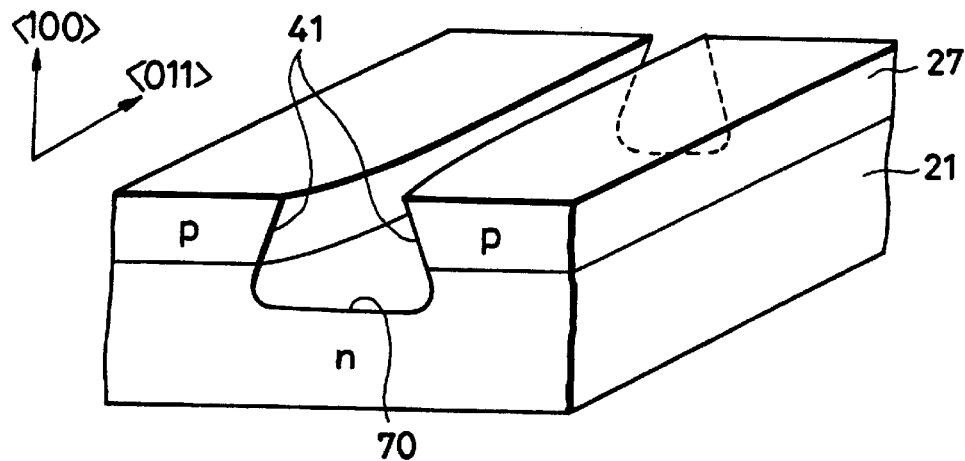
FIG. 11 is a manufacturing process diagram of another one example of the semiconductor laser according to the present invention.

Also, each of the above-mentioned examples is one in which the semiconductor portion 40 arranging an operating portion of the semiconductor laser is formed in the ridge 22 which is formed by being sandwiched between the stepped portions 41, but there can also be an arrangement in which the semiconductor portion 40 arranging the operating portion of the similar semiconductor laser can be formed in the groove formed by being sandwiched between the stepped portions 41. FIG. 10 shows a schematic perspective diagram of one example of the cases. The example will, in order to make it easy to comprehend the same, be explained with reference to the process diagrams in FIG. 11 to FIG. 13 together with one example of its manufacturing methods.

In the example, too, on one major surface of a {100} crystallin surface of, for example, a (100) crystalline surface of a compound semiconductor substrate 21 of the first conductivity-type, that is, a p-type consisting of, for example, AlGaAs, first of all, an electric current blocking layer 27 of the second conductivity-type, for example, an n-type is epitaxially grown over the whole surface thereof by way of the MOCVD method and the like by using in the example, for example, a gas from an organic metal material of a methyl or ethyl system.

Then, a stripe shaped groove 70 is formed in depth ranging from the surface of the electric current blocking layer 27 to the substrate 21 extending in an <011> axis direction of, for example, an [011] axis direction.

The shape of the groove 70 is formed broader in width on the front end surface side arranging the front light emitting end surface compared with that in the central portion which is more backward than this and that in the rear end portion on the rear light emitting end surface side. The groove 70 can be formed by way of a crystallographic etching method by sulfuric acid method etching using, for example, photolithography. The groove 70 formed by way of the etching method becomes a so-called inverted mesa shaped groove which spread toward a bottom portion between the opposing stepped portions 41 by inclined surfaces.

Figure 12:
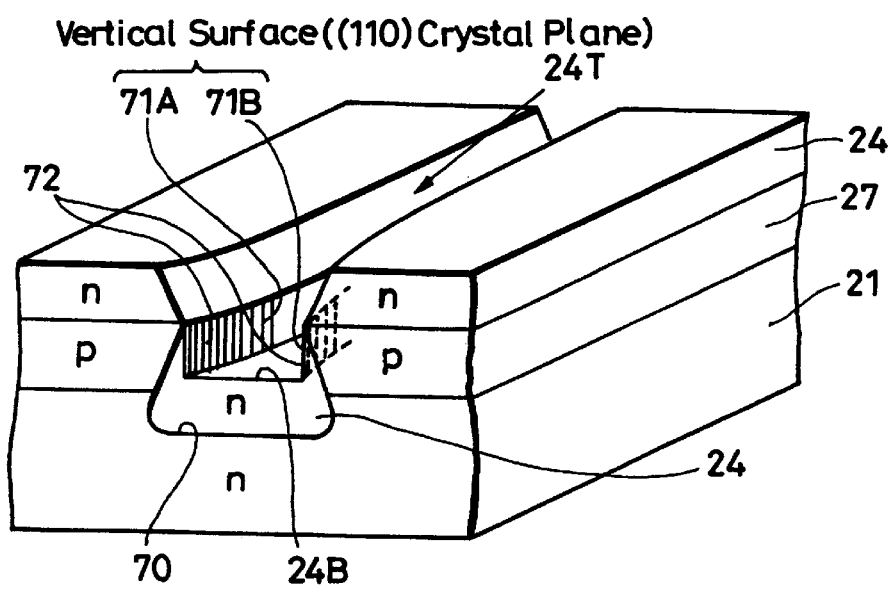
FIG. 12 is a manufacturing process diagram of another one one example of the semiconductor laser according to the present invention.

Next, as shown in FIG. 12, on a surface where the groove 70 is formed, the first cladding layer 24 of the first conductivity-type, for example, the n-type, consisting of, for example, AlGaAs is epitaxially grown over the whole surface where the groove 70 is formed including the inside of the groove 70 by way of the MOCVD method of the above-mentioned methyl system.

At that time, along the surfaces of the stepped portions 41 of the groove 70, the epitaxial growth gradually progresses, with resultant generation of vertical surfaces 71A and 71B consisting of the {110} crystalline surfaces perpendicular to the major surface of the substrate 21. Then, when the {110} crystalline surfaces generate, since a growth speed to the surfaces is extremely slow compared with the {100} crystalline surface, inside the groove 70, a plane surface 24B occurs within the groove 70 along the bottom surface of the groove 70.

Meanwhile, at an upper portion of the stepped portions 41 of the groove 70, an inclined surface 24T consisting of a {111} B crystalline surface occurs from a side edge portion extending in the <011> crystal axis direction. Then, the inclined surface 24T consisting of the {111} B crystalline surface, due to the growth speed thereof being extremely slow as mentioned above, grows as it arranges a mesa shaped concave portion by being separated from the growing layer inside the groove 70.

At this time, the vertical surfaces 71A and 71B, since the side surfaces of the groove 70 gradually become gradually narrowing curved surfaces from an end portion to a central portion, that is, the surfaces which do not coincide with the <011> direction, become a congregating surface 72 which intermittently congregates the {111} B crystal surfaces.

Figure 13:
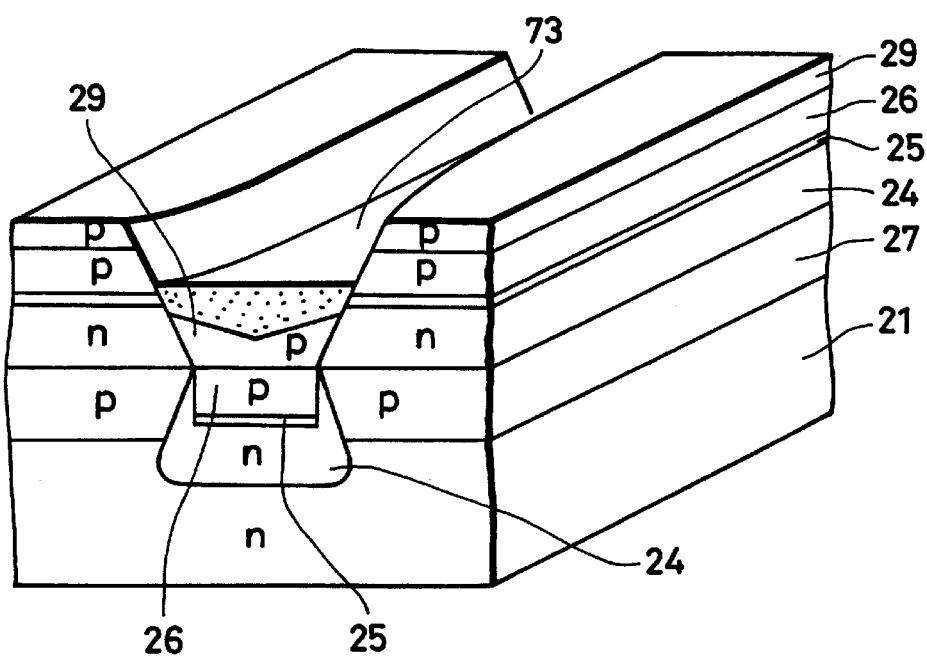
FIG. 13 is a manufacturing process diagram of another example of the semiconductor laser according to the present invention.

Next, as shown in FIG. 13, on the first cladding layer 24, the active layer 25 of the quantum well structure explained in, for example, FIG. 4, the second cladding layer 26 consisting of, for example, AlGaAs and the capping layer 29 consisting of GaAs, respectively of the second conductivity-type or the p-type are epitaxially grown by way of the methyl MOCVD method.

At this time, since the active layer 25, the cladding layer 26 and the capping layer 29 do not almost grow on the vertical surfaces 71A and the 71B, the respective layers are formed by being separated one another on the flat plane 24B inside the groove 70 and on the upper surface of the stepped portion 41.

Then, a mask 73 consisting of a photoresist and the like is further painted to cover up the capping layer 29 inside the concave portion between the opposing inclined surfaces 24T and an anisotropy etching such as RIE (reactive ion etching) and the like is carried out to flatten the surface.

Thereafter, the mask 73 is removed and a p-type impurity of the second conductivity-type such as, for example, Zn and the like is diffused over the whole surface to form a surface layer 74 shown in FIG. 10.

Figure 8:
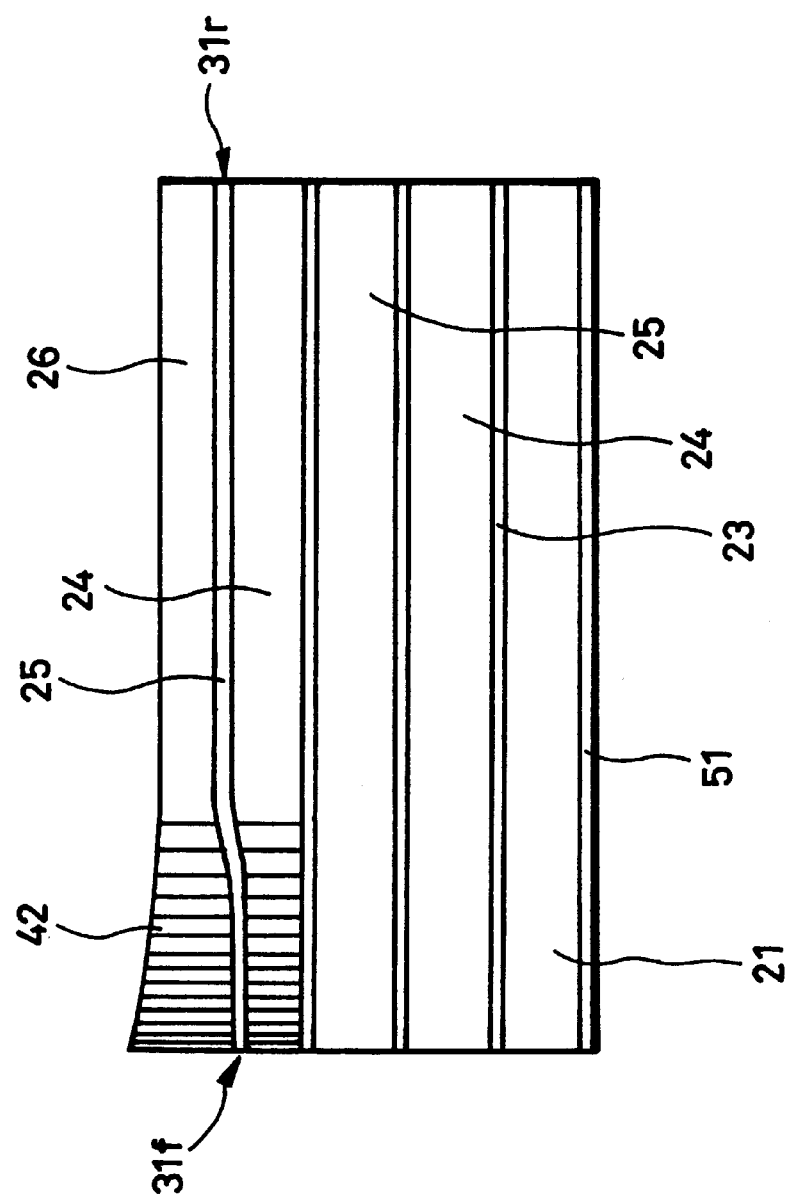
FIG. 8 is a side view of an essential portion of one example of the semiconductor laser according to the present invention.

By doing in this manner, as shown in FIG. 8, within the groove 70, a stripe shaped resonator having the stripe shaped active resonator 25 separated from the outside of the groove 70 on both sides, which carries out laser oscillation is formed. Then, the active layer, that is, resonator is arranged broad in width on the front end surface 31f side.

Then, on the surface layer 74 and on the rear surface of the substrate 21, the first and the second electrodes 51 and 52 are ohmic-deposited.

With the semiconductor laser having the arrangement, the same effect as that explained in FIG. 3 can be obtained.

Also, by applying the arrangement in which the semiconductor laser is formed inside the groove to each of the semiconductor laser elements, the multi-semiconductor laser in which a plurality of the semiconductor laser elements are disposed on the common substrate 21 can be arranged.

Also, the semiconductor laser and the multi-semiconductor laser according to the present invention are not limited to the above-mentioned arrangement, but various kinds modifications can be carried out such as, for example, in the arrangement of FIG. 3 and FIG. 9, the buffer layer is omitted or in the arrangement of FIG. 10, the buffer layer is formed.

In the above-mentioned arrangement according to the present invention, since the width Wf on the front end surface side is made larger compared with other portions, the FFP of the emitting light from the front side can be made smaller. Therefore, it is possible to use the laser light as a source of laser light for a light pick-up apparatus and the like which carry out reproduction and/or recording of information by irradiating the laser light on a CD (Compact Disk), an MD (Mini Disk) and the like or to make a coupling efficiency with an optical system large when the laser light is used as a source of light and the like for a laser printer.

In this manner, although the width of the active layer at the front end surface is made large in order to make small the FFP with respect to the front side emitting laser light, since the width backward than this is made small, it is possible to avoid an increase in the threshold value electric current $1_{th}$.

Also, according to the semiconductor laser and the multi-semiconductor laser of the present invention, with the thickness of the active layer 25 being arranged thin on the front end surface side, when the active layer 25 is made a single or a multi-quantum well structure, since its quantum level increases due to the thickness becoming thinner, the lights which are generated at the center and at the rear become transparent on the front area and the absorption of the light at the area is reduced and as a result, the heat generation can be effectively avoided and a so-called window structure in which high output is implemented can be arranged.

Also, even in the arrangement where the reflection factor at the rear end surface is made lower than the reflection factor at the front end surface for implementing the improvement of the droop characteristic, by avoiding making large the width of the active layer, that is, the width at the end surface of the resonator on the rear end surface side, an emission angle can be made large with respect to the rear emitting laser light. Therefore, even when the light detecting elements such as the monitoring photodiode and the like are made to receive the laser light from the rear end side, or when the light detecting element is closely disposed, the light density to be received can be reduced, thereby making it possible to accurately carry out power detection of the laser light with certainty without saturating the light detection.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A semiconductor laser being characterized in that a striped portion extending in an <011> crystal axis direction of a compound semiconductor substrate in which a {100} crystalline surface is made a major surface is formed between stepped portions, a laser resonator is arranged in said striped portion,
   a width of said striped portion is, at one end surface of said laser resonator, made broad in width compared with a central portion and an other end surface of said laser resonator,
   in accordance with a shape of said stripe portion, an active layer of said laser resonator is formed, and the active layer of said stripe portion has an arrangement in which a thickness thereof changes in response to a change in the width of said stripe portion.

2. A semiconductor laser as claimed in claim 1, being characterized in that a reflection factor on said o:e end surface of said laser resonator is chosen to be larger than a reflection factor at said other end surface.

3. A multi-semiconductor laser being characterized in that a plurality of stripe portions extending in an <011> crystal axis direction of a compound semiconductor substrate in which a {100} crystalline surface is made a major surface are formed between a plurality of stepped portions, laser resonators are respectively arranged in said stripe portions, widths of said stripe portions are made wider, at one end surface of said laser resonator, compared with those in a central portion and at an other end surface of said laser resonator, in accordance with a shape of said stripe portion, an active layer of said laser resonator is formed, and the active layer of said stripe portions have an arrangement in which a thickness thereof changes in response to a change in the width of said stripe portions.

4. A multi-semiconductor laser as claimed in claim 3, being characterized in that a reflection factor on said one end surface of said laser resonator is chosen to be larger than a reflection factor at said other end surface.

* * * * *